(12) United States Patent
Surthi et al.

(10) Patent No.: US 10,347,634 B2
(45) Date of Patent: Jul. 9, 2019

(54) APPARATUSES INCLUDING BURIED DIGIT LINES

(71) Applicant: Micron Technology, Inc., Boise, ID (US)

(72) Inventors: Shyam Surthi, Boise, ID (US); Suraj Mathew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/942,938

(22) Filed: Apr. 2, 2018

(65) Prior Publication Data

US 2018/0226406 A1    Aug. 9, 2018

Related U.S. Application Data

(63) Continuation of application No. 13/354,957, filed on Jan. 20, 2012, now Pat. No. 9,947,666.

(51) Int. Cl.

| H01L 27/105 | (2006.01) |
|---|---|
| H01L 21/768 | (2006.01) |
| H01L 21/74 | (2006.01) |
| H01L 27/108 | (2006.01) |

(52) U.S. Cl.
CPC ........ *H01L 27/1052* (2013.01); *H01L 21/743* (2013.01); *H01L 21/76897* (2013.01); *H01L 27/10885* (2013.01)

(58) Field of Classification Search
CPC ......... H01L 43/08; H01L 43/10; H01L 43/12; H01L 51/56; H01L 43/02
USPC ....................................................... 257/773
See application file for complete search history.

(56) References Cited

U.S. PATENT DOCUMENTS

| 7,015,528 | B2 | 3/2006 | McClure |
|---|---|---|---|
| 7,364,966 | B2 | 4/2008 | Green et al. |
| 7,776,715 | B2 | 8/2010 | Wells et al. |
| 2006/0046391 | A1* | 3/2006 | Tang ................. H01L 27/10876 438/268 |
| 2007/0035027 | A1 | 2/2007 | Gonzalez et al. |
| 2007/0235789 | A1 | 10/2007 | Doebler |
| 2011/0220994 | A1 | 9/2011 | Parekh et al. |
| 2012/0299088 | A1 | 11/2012 | Heineck et al. |
| 2013/0187279 | A1 | 7/2013 | Surthi et al. |

* cited by examiner

*Primary Examiner* — Andy Huynh
(74) *Attorney, Agent, or Firm* — TraskBritt

(57) ABSTRACT

Methods of forming semiconductor device structures include forming trenches in an array region and in a buried digit line end region, forming a metal material in the trenches, filling the trenches with a mask material, removing the mask material in the trenches to expose a portion of the metal material, and removing the exposed portion of the metal material. A plurality of conductive contacts is formed in direct contact with the metal material in the buried digit line end region. Methods of forming a buried digit line contact include forming conductive contacts physically contacting metal material in trenches in a buried digit line end region. Vertical memory devices and apparatuses include metallic connections disposed between a buried digit line and a conductive contact in a buried digit line end region.

8 Claims, 12 Drawing Sheets

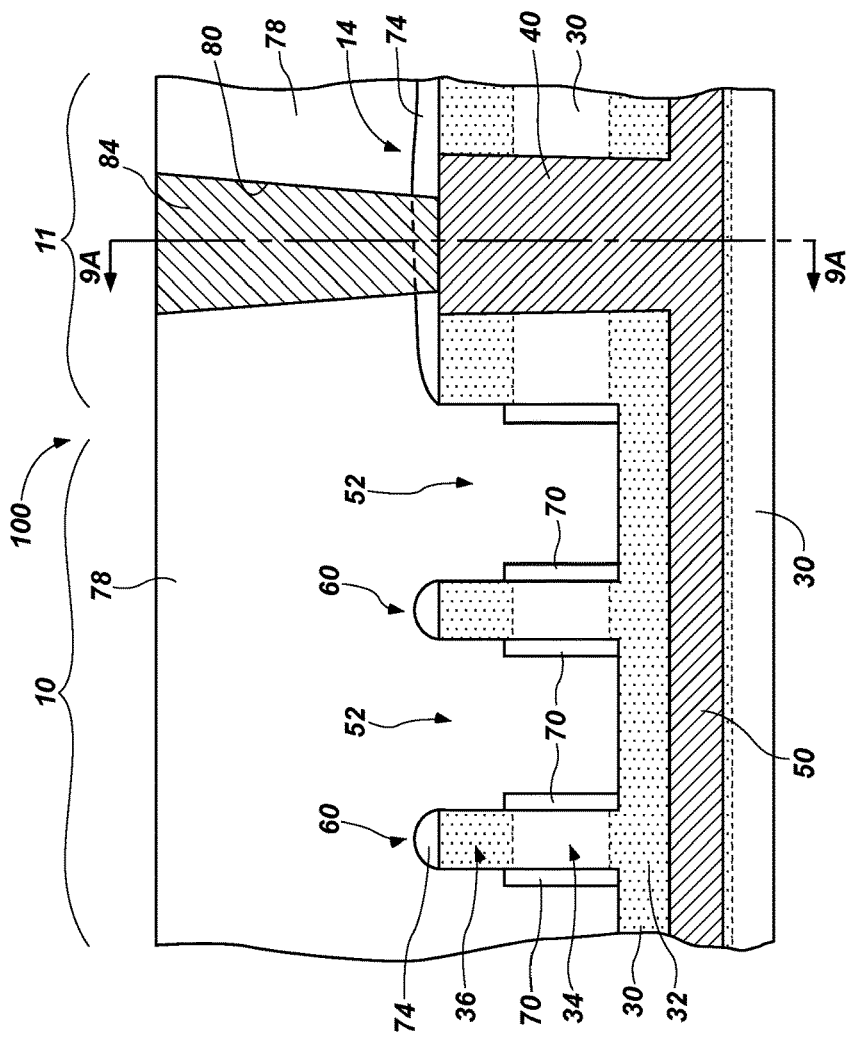
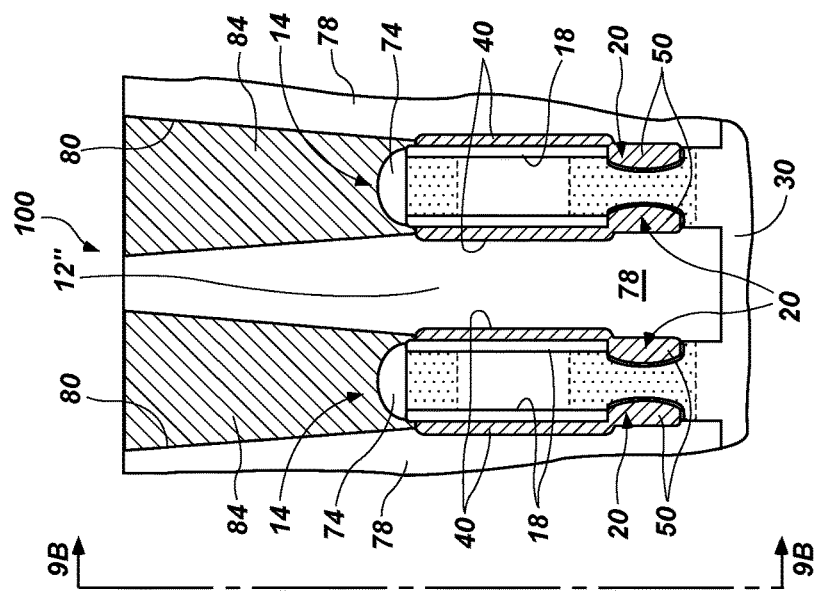
FIG. 9B
FIG. 9A

APPARATUSES INCLUDING BURIED DIGIT LINES

CROSS-REFERENCE TO RELATED APPLICATION

This application is a continuation of U.S. patent application Ser. No. 13/354,957, filed Jan. 20, 2012, now U.S. Pat. No. 9,947,666, issued Apr. 17, 2018 the disclosure of which is hereby incorporated herein in its entirety by this reference.

TECHNICAL FIELD

Embodiments of the present disclosure relate to semiconductor device structures including buried digit lines, and to methods of forming such structures. More specifically, embodiments of the present disclosure relate to methods of fabricating semiconductor device structures employing metallic connections between buried digit lines and contacts.

BACKGROUND

Increased demand for computer memory has driven the memory industry to introduce various configurations and designs of transistors to fit more memory into a given area and, therefore, to create memory devices with increased memory density. One such memory device with the potential for increased memory density is the so-called "vertical memory" device. A vertical memory device includes an array of transistors with each transistor extending generally perpendicular to a substrate, such as a silicon substrate. Each transistor of the vertical memory device can include silicon and may have several doped regions. For example, a bottom region may be n-doped, a middle region may be p-doped, and a top region may be n-doped. The bottom, n-doped region may be a source region and the top, n-doped region may be a drain region. A gate material, such as a gate oxide, may be formed along a vertical sidewall of the transistor to cover the middle, p-doped region and to contact a portion of the top and bottom n-doped regions, respectively. A buried metal data/sense line (e.g., a digit or bit line) for reading and writing data to the transistors may contact multiple source regions and may extend across multiple transistors in a first direction. An access line (e.g., a word line) for reading and writing data to the transistors may be formed over the gate material along the vertical sidewall of the transistor and may extend across multiple transistors in a second direction that is generally perpendicular to the first direction.

Buried digit lines contacting adjacent source regions may be separated by a trench extending in the first direction. Access lines contacting transistors adjacent to each other in the first direction may be separated by another trench that extends in the second direction. Such trenches may generally be filled with one or more dielectric (i.e., non-conductive) material, such as silicon oxide, silicon nitride, air, etc., for providing electrical isolation between adjacent bit lines and access lines, respectively.

A digit line end region may be located proximate an edge of the array. Conventionally, the digit line end region includes a silicon pillar extending vertically between each buried digit line and a digit line contact. In addition to forming the substrate with the doped source and drain regions in the array region described above, the silicon pillar in the buried digit line end region is heavily doped so as to be conductive for electrically connecting each buried digit line to each digit line contact. Such a doped silicon pillar may present several problems in manufacturing a vertical memory device and possibly in the device performance. For example, the doped silicon may add to electrical resistance between the digit line contact and the buried digit line due to metal-to-silicon contacts. If the silicon pillar is doped too heavily, then the dopant may extend into the substrate and electrical separation between adjacent digit lines may be lost. Furthermore, the doping may cause crystal damage in the silicon pillar. Crystal damage may further increase resistance across the doped region such as by increased oxygen absorption during subsequent processing. In addition, device performance is negatively affected by non-uniform doping through the depth of the silicon pillar. However, uniform doping of the silicon pillar may be difficult and expensive to achieve. Furthermore, there may be some variation in the depth of the buried digit lines across vertical memory devices, which adds to the difficulties of doping each silicon pillar to the appropriate depth to form an electrical connection. Furthermore, the dopants implanted in the silicon pillar may require activation through additional processing (e.g., curing, annealing, etc.), which adds to the manufacturing difficulty and cost.

BRIEF DESCRIPTION OF THE DRAWINGS

FIGS. 1 through 9B illustrate an embodiment of a method of forming an apparatus according to the present disclosure.

FIG. 9A shows a partial cross-sectional side view of an embodiment of a vertical memory array of the present disclosure taken along section line 9A-9A in FIG. 9B.

FIG. 9B shows a partial cross-sectional side view of the memory array of FIG. 9A taken along section line 9B-9B in FIG. 9A.

DETAILED DESCRIPTION

Figure 1:
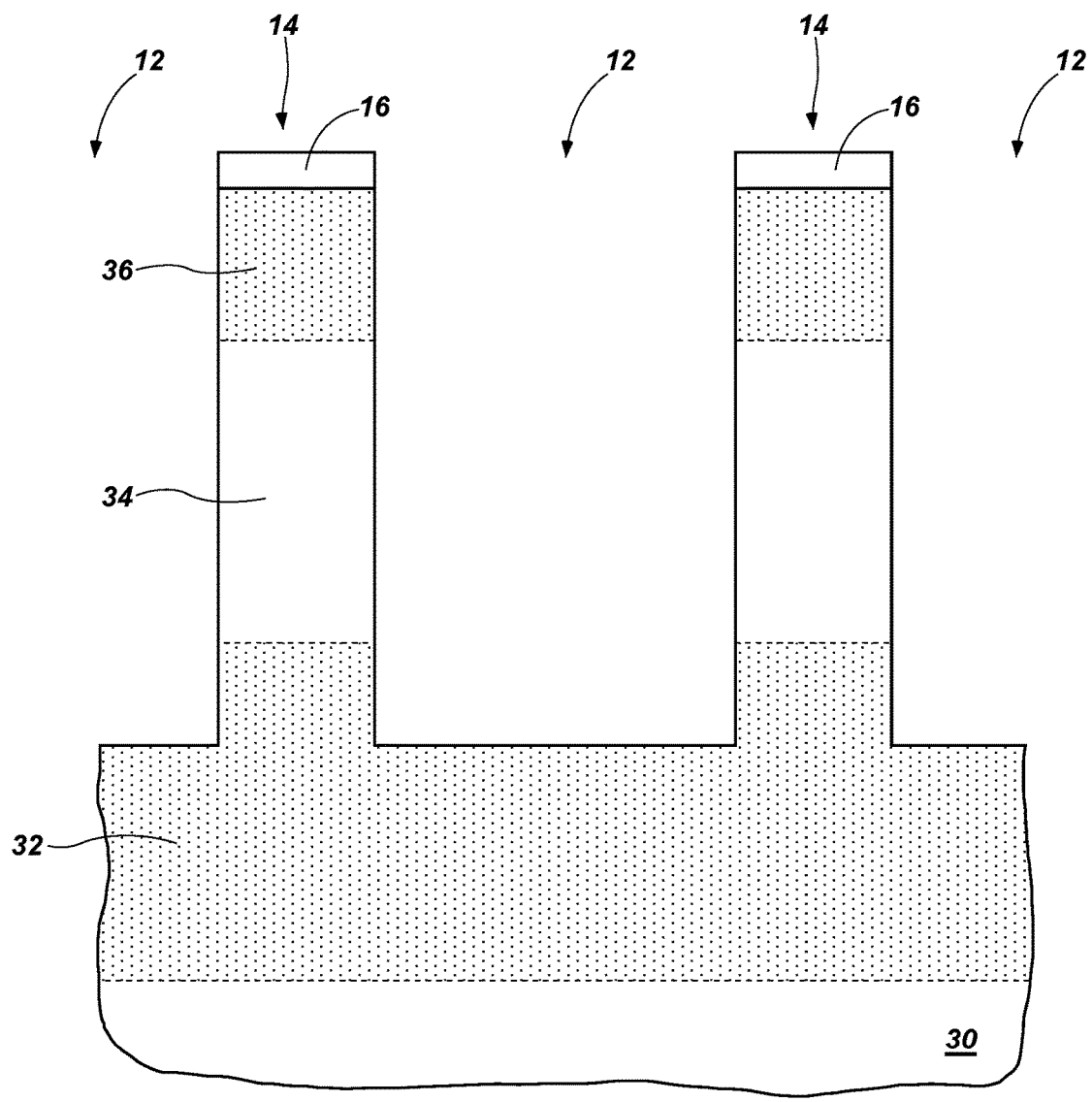

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the semiconductor industry.

In addition, the description provided below does not describe a complete process flow for manufacturing memory devices. The memory devices described below do not form complete semiconductor devices. The remainder of the process flow and memory devices are known to those of ordinary skill in the art. Accordingly, only the methods and memory devices necessary to understand embodiments of the present disclosure are described in detail herein. Additional acts to form complete memory devices and systems may be performed by conventional fabrication techniques known to those of ordinary skill in the art.

As used herein, any relational term, such as "first," "second," "over," "top," "bottom," "upper," "underlying," "below," etc., is used for clarity and convenience in understanding the present disclosure and accompanying drawings and does not connote or depend on any specific preference, orientation, or order, except where the context clearly indicates otherwise.

As used herein, the terms "vertical" and "vertically" refer to a direction generally perpendicular to a major plane in which a substrate (e.g., a wafer, a microchip, etc.) extends. The "vertical" direction is relative to the substrate and does not depend on any particular orientation or view of the substrate as a whole. For purposes of understanding the present disclosure, a "vertical" direction is up and down when viewed in the perspective of FIG. 1, for example.

As used herein, the terms "horizontal" and "horizontally" refer to a direction generally parallel to a major plane in which the substrate (e.g., a wafer, a microchip, etc.) extends. The "horizontal" direction is relative to the substrate and does not depend on any particular orientation or view of the substrate as a whole. For purposes of understanding the present disclosure, a "horizontal" direction may be left and right or in and out of the page when viewed in the perspective of FIG. 1, for example.

As used herein, the term "apparatus" means and includes a device, such as a memory device (e.g., a so-called "vertical memory device"), or a system that includes such a device.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances.

As used herein, the term "forming" means and includes any method of creating, building, patterning, or depositing a feature or material. For example, forming may be accomplished by atomic layer deposition (ALD), chemical vapor deposition (CVD), physical vapor deposition (PVD), sputtering, co-sputtering, spin-coating, diffusing, depositing, growing, photolithography, dry etching, wet etching, or any other technique known in the art of semiconductor fabrication. Depending on the specific feature to be formed, the technique for forming the feature may be selected by a person of ordinary skill in the art.

In the following detailed description, reference is made to the accompanying drawings, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, compositional, and electrical changes may be made without departing from the scope of the present disclosure. The illustrations presented herein are not meant to be actual views of any particular system, device, structure, or memory cell, but are merely idealized representations which are employed to describe the embodiments of the present disclosure. The drawings presented herein are not necessarily drawn to scale. Additionally, elements common between drawings may retain the same numerical designation.

The embodiments of the present disclosure include methods for forming a semiconductor device structure including digit lines. The digit lines of the structure may be buried digit lines that are generally located vertically below some other features of the structure, such as transistors, access lines (e.g., word lines), etc. The embodiments of the present disclosure also include memory arrays, devices, and other semiconductor devices including buried digit lines. Each of the buried digit lines may extend horizontally in an array region and in a digit line end region. Additionally, a metal material may extend between each buried digit line and a conductive contact in the buried digit line end region, as will be described in more detail below.

Embodiments of methods that may be used to form a semiconductor device having buried digit lines, such as a vertical memory device, are described with reference to FIGS. 1 through 9B. Although the embodiments shown in FIGS. 1 through 9B illustrate dynamic random-access memory (DRAM), embodiments of the present disclosure may be used in additional types of computer memory that include buried digit lines, such as complementary metal oxide semiconductor (CMOS), NAND, etc. FIGS. 1 through 9B illustrate a structure at different stages of the formation of the semiconductor device, respectively.

FIG. 1 is a cross-sectional side view of a structure from which a semiconductor device, such as a vertical memory device, may be formed. The formation of the structure shown in FIG. 1 includes forming a substrate 30 with a plurality of doped regions 32, 34, and 36. The substrate 30 may be a silicon substrate or other suitable substrate known in the art of semiconductor devices. The substrate 30 may be doped, such as p-doped. A first source/drain region 32 (e.g., a source region) of the substrate 30 may be formed by doping the region with an n-type dopant. A mid-channel region 34 of the substrate 30 may be a p-doped region of the substrate 30. The mid-channel region 34 may be a portion of the bulk p-doped substrate 30, or may be doped with additional p-type dopant, as is known in the art. A second source/drain region 36 (e.g., a drain region) of the substrate 30 may be doped with an n-type dopant. Therefore, the first source/drain region 32, the mid-channel region 34, and the second source/drain region 36 are formed from the substrate 30 and may be referred to collectively as "regions of the substrate 30". Any of the regions 32, 34, and 36 may have a dopant concentration gradient across the region. For example, the first source/drain region 32 may include a lower portion that is heavily doped and an upper portion that is lightly doped relative to the lower portion. Such a dopant concentration gradient may reduce current leakage during operation of a semiconductor device that includes the first source/drain region 32.

In the configuration described above with reference to FIG. 1, the regions 32, 34, and 36 may form a vertical NPN transistor. However, the present disclosure is not limited to configurations including NPN transistors. The doping of the regions 32, 34, and 36 may be reversed, such that the first source/drain region 32 is p-doped, the mid-channel region 34 is n-doped, and the second source/drain region 34 is p-doped to form a vertical PNP transistor. Thus, the present disclosure is not limited to the particular doping scheme described above with reference to FIG. 1.

A mask 16 may be formed and patterned over the substrate 30. Material from the substrate 30 may be removed in areas not covered by the mask 16 to form a plurality of columns 14 separated by a plurality of first trenches 12. Material may be removed from the substrate 30 by etching material of the substrate 30, for example by conducting an anisotropic dry etch act that selectively removes material of the substrate 30 but allows the mask 16 to remain. The mask 16 may include, for example, a nitride material (e.g., SiN) or other suitable material known in the art. Optionally, an oxide material (not shown), such as $SiO_2$, may be formed over the substrate 30 prior to formation of the mask 16. Thus, in some embodiments, an oxide material may be disposed between the substrate 30 of the columns 14 and the mask 16. The first trenches 12 may have a depth sufficient to expose, and optionally to remove, at least some of the first source/drain region 32 of the substrate 30 in the areas not covered by the mask 16. For example, in embodiments with a first source/drain region 32 having a dopant concentration gradient, material from the substrate 30 may be removed to expose a lightly doped upper portion of the first source/drain region 32 at the bottom of the first trenches 12 while leaving a heavily doped lower portion thereof unexposed. The first trenches 12 may horizontally extend in a first direction (e.g., in and out of the page when viewed in the perspective of FIG. 1).

Figure 2:
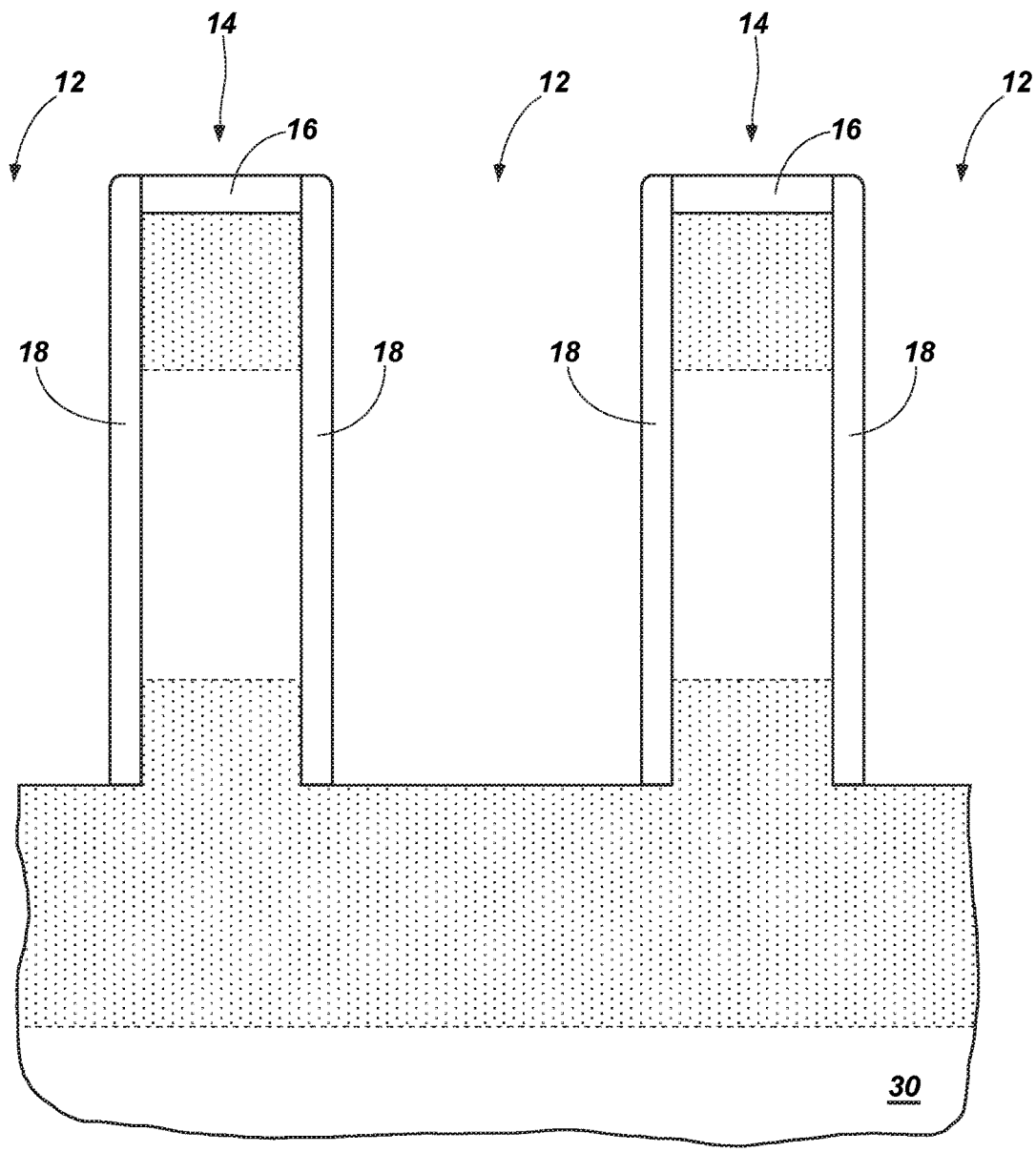

As shown in FIG. 2, sidewall liners 18 may be formed on sidewalls of the columns 14 by, for example, conformally depositing a liner material and removing the liner material from horizontal surfaces, such as from surfaces at the bottom of the first trenches 12 and top surfaces of the columns 14. The sidewall liners 18 may include, for example, an oxide material (e.g., $SiO_2$), a nitride material (e.g., SiN), or a combination thereof. The sidewall liners 18 may inhibit removal of the material of the columns 14 immediately underlying the sidewall liners 18 during a subsequent material removal act, as will be described in more detail below with reference to FIG. 3.

Figure 3:
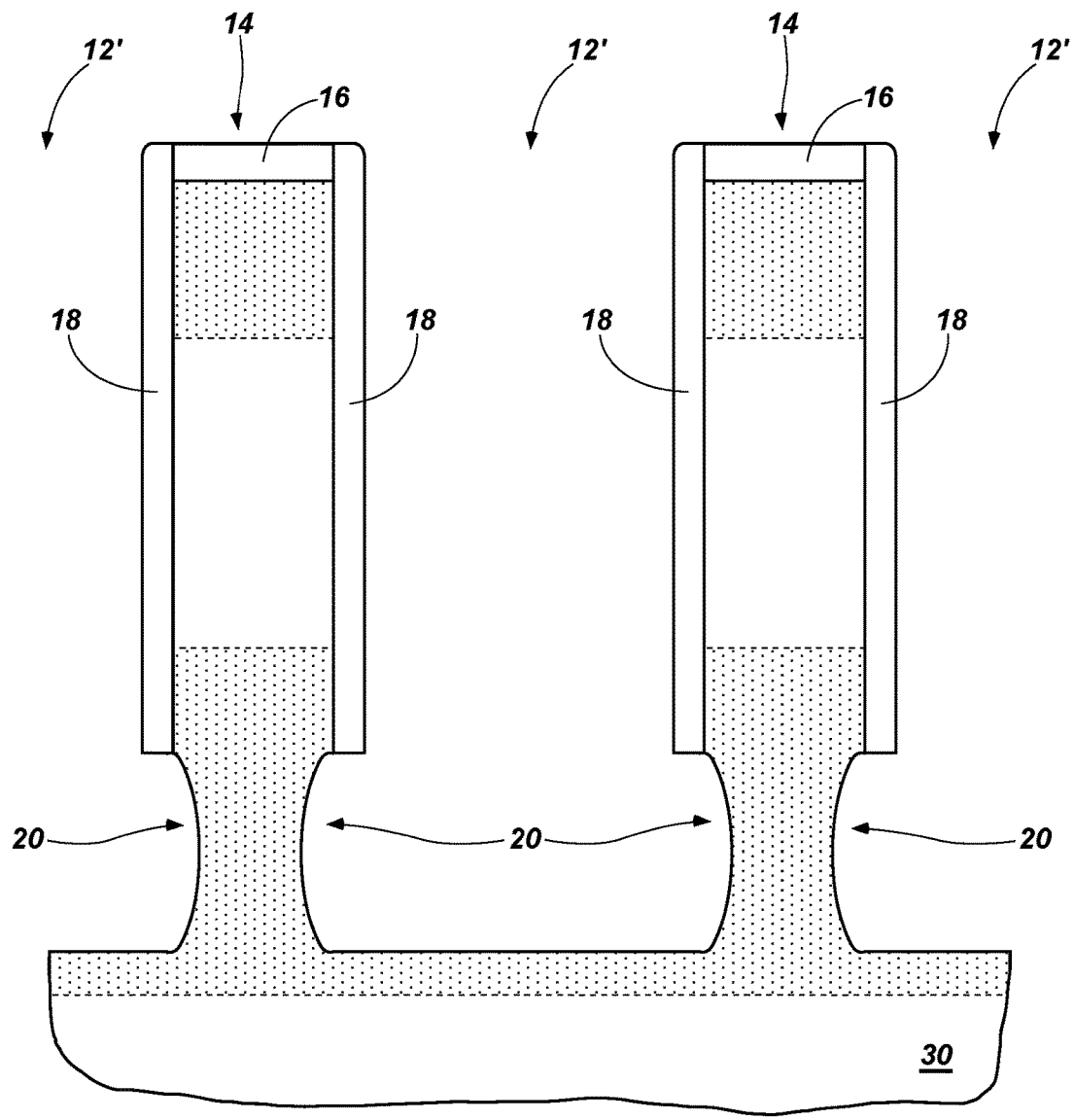

Next, the first trench 12 may be extended deeper into the substrate 30 by removing a portion of the material of the substrate 30 to form a first trench 12', as shown in FIG. 3. By way of example and not limitation, the substrate 30 may be subjected to an etch (e.g., an isotropic dry etch, an isotropic wet etch, a combination of isotropic and anisotropic etches, etc.) to both vertically extend the first trench 12' deeper and additionally remove material horizontally from the columns 14. An etchant may be used to selectively remove exposed material of the substrate 30 and, therefore, may not remove material of the mask 16 and the sidewall liners 18, as shown in FIG. 3. A horizontally recessed region 20 (e.g., an undercut region) in the substrate 30 may be formed where the material of the substrate 30 is removed from vertically below the sidewall liners 18, when viewed in the perspective of FIG. 3.

Figure 4:
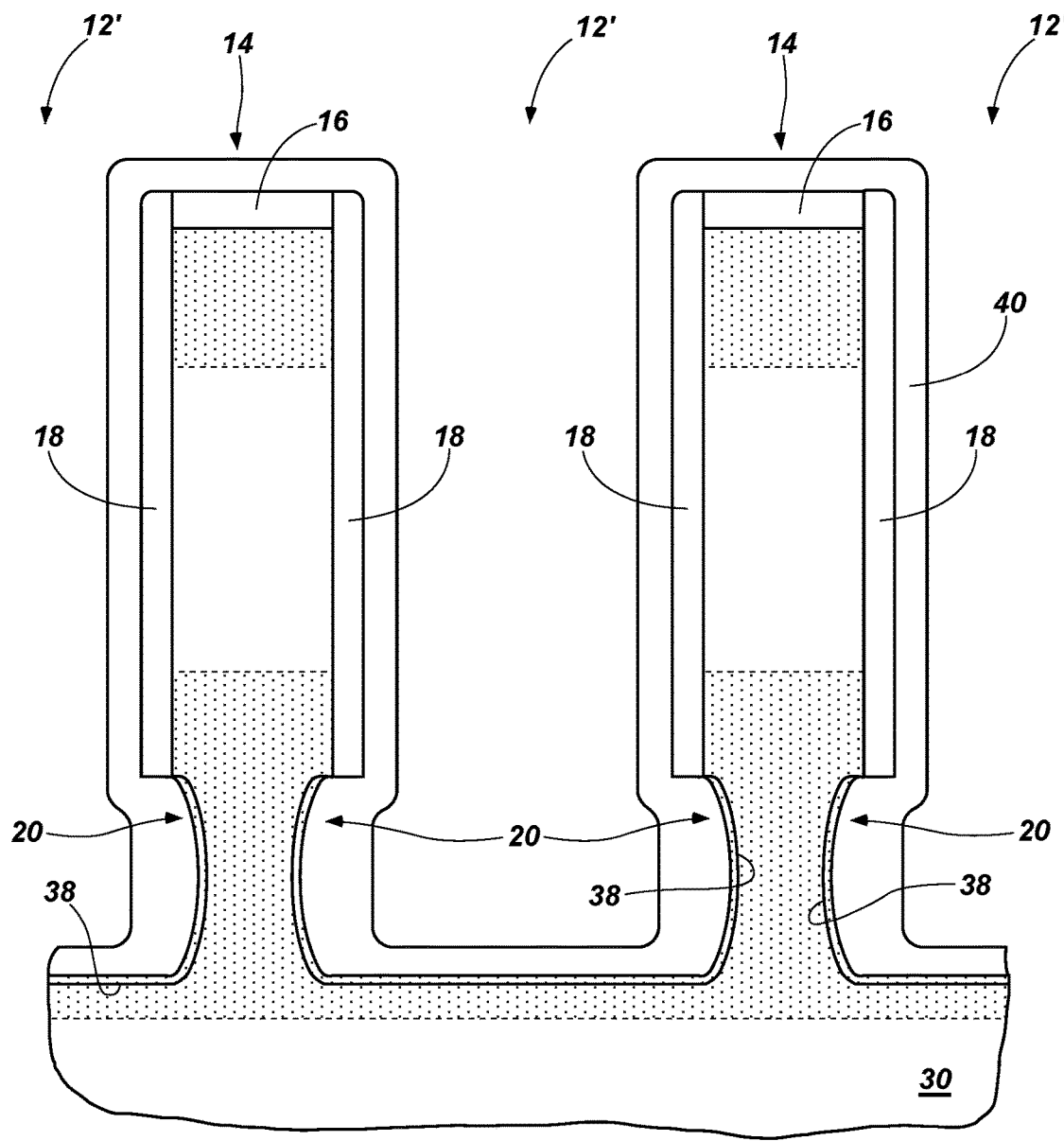

Referring now to FIG. 4, the structure may be cleaned to remove surface defects, as known in the art, in preparation for forming a metallization material 38 over the structure. A metallization material 38 may be formed over the structure. The metallization material 38 may be conformally deposited over the mask 16, the sidewall liners 18, and the substrate 30. The metallization material 38 may include, for example, titanium or cobalt. Optionally, the metallization material 38 may be heated (e.g., annealed) to react the metallization material 38 with the substrate 30, such as to form a metal silicide (e.g., titanium silicide, cobalt silicide), at an interface between the metallization material 38 and the substrate 30. Portions of the metallization material 38 that do not react with the substrate 30 (e.g., the metallization material 38 formed over the mask 16 and the sidewall liners 18) may optionally be removed by, for example, a wet clean. The metallization material 38 may remain along exposed surfaces of the substrate 30, such as in the form of a metal silicide (e.g., titanium silicide, cobalt silicide), as shown in FIG. 4.

After the metallization, a metal material 40 may be formed over the structure. At formation, the metal material 40 may be located over the top of the columns 14, along the sidewalls of the columns 14 (including in the horizontally recessed regions 20), and over the substrate 30 at the bottom of the first trenches 12'. The metal material 40 may include a metal suitable for the formation of buried digit lines, as will be appreciated by one of ordinary skill in the art. By way of example only, the metal material 40 may include at least one of titanium, titanium nitride (TiN), tantalum nitride (TaN), ruthenium, tungsten, and tungsten nitride (WN). The presence of the metallization material 38 may provide improved adhesion and reduced electrical resistance between the metal material 40 and the underlying substrate 30.

Figure 5:
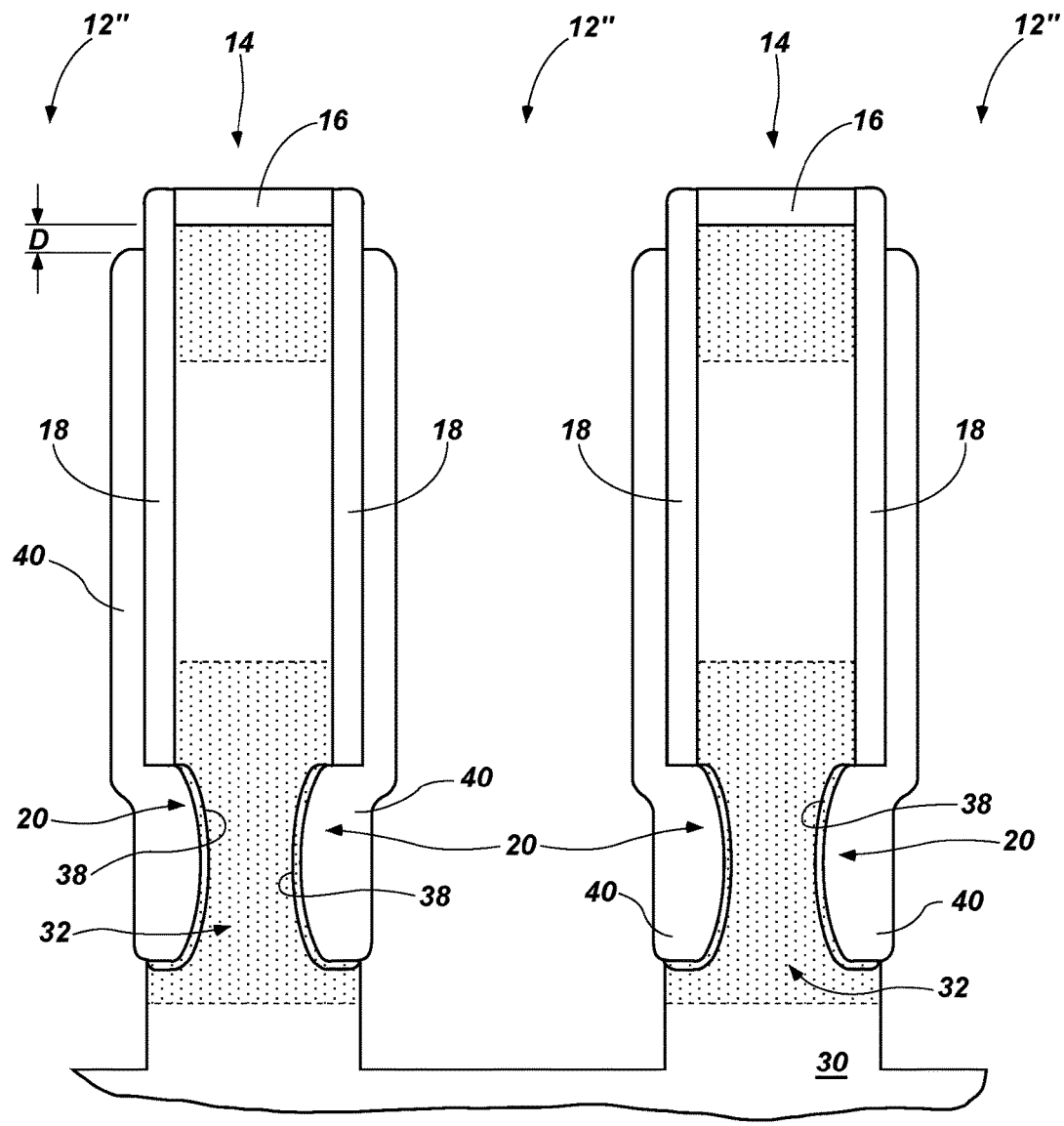

Portions of the metal material 40 may then be removed from horizontal surfaces (e.g., the top surfaces of the columns 14, the bottom surface of the first trench 12') to form the first trench 12", as shown in FIG. 5. At least some metal material 40 may remain along the sidewall liners 18 and in the horizontally recessed regions 20. By way of example, an anisotropic etch may be performed to remove the portions of the metal material 40 from the horizontal surfaces. Removing the portions of the metal material 40 from horizontal surfaces may separate the metal material 40 along each sidewall of the columns 14 defining the first trenches 12" from the metal material 40 along adjacent sidewalls. Some material from the substrate 30 may also be removed at the bottom of the first trench 12". Such a removal of substrate material may also separate and electrically isolate adjacent first source/drain regions 32, if such separation has not already occurred. Removing portions of the metal material 40 from the horizontal surfaces of the structure may also cause the top of the metal material 40 along the sidewall liners 18 to vertically recess a distance D from the top of the substrate 30 in the columns 14. By way of example and not limitation, the distance D between the top of the metal material 40 and the top of the substrate 30 in the columns 14 may be between about 0 nm and about 20 nm.

Figure 6A:
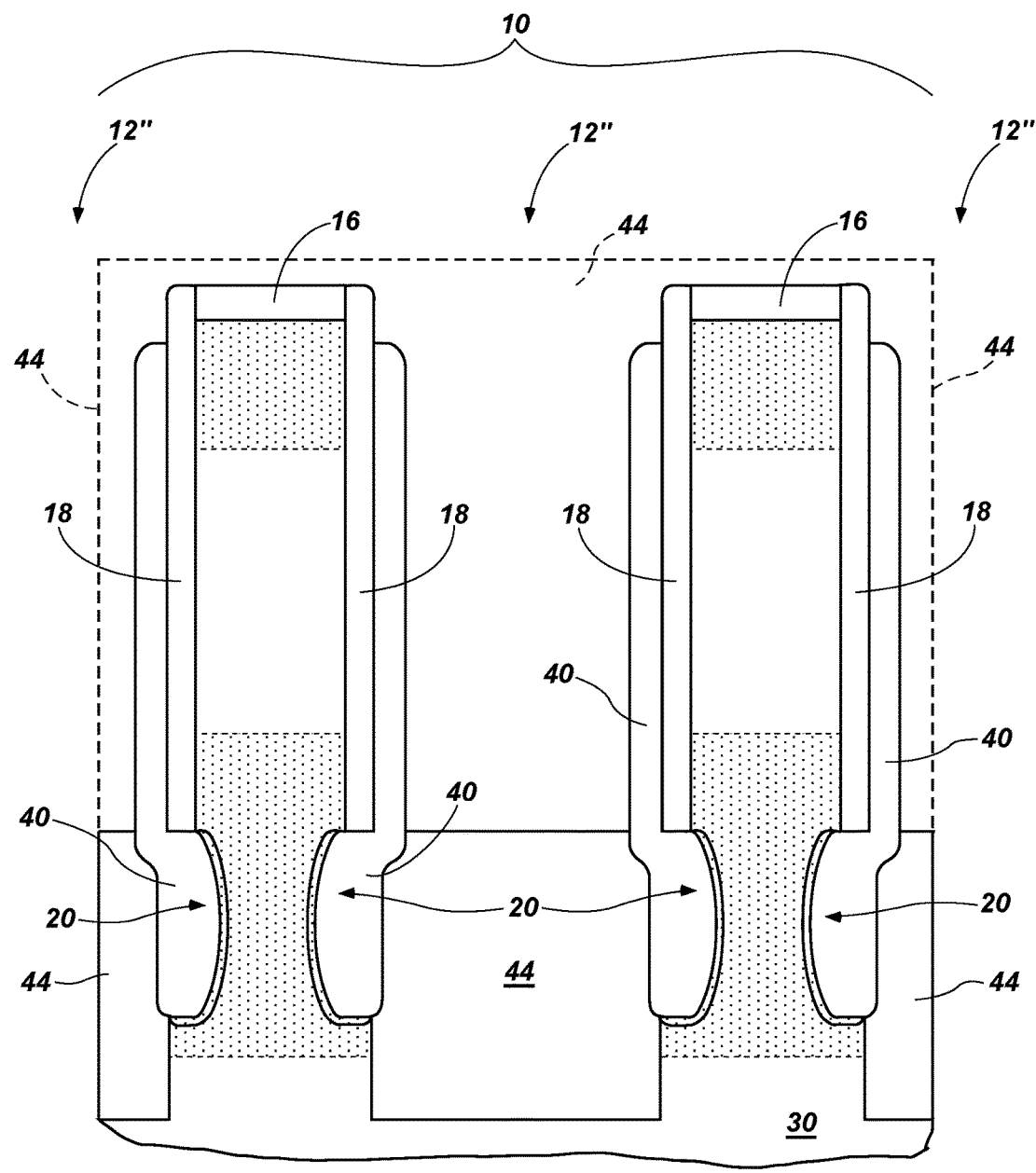
Figure 6B:
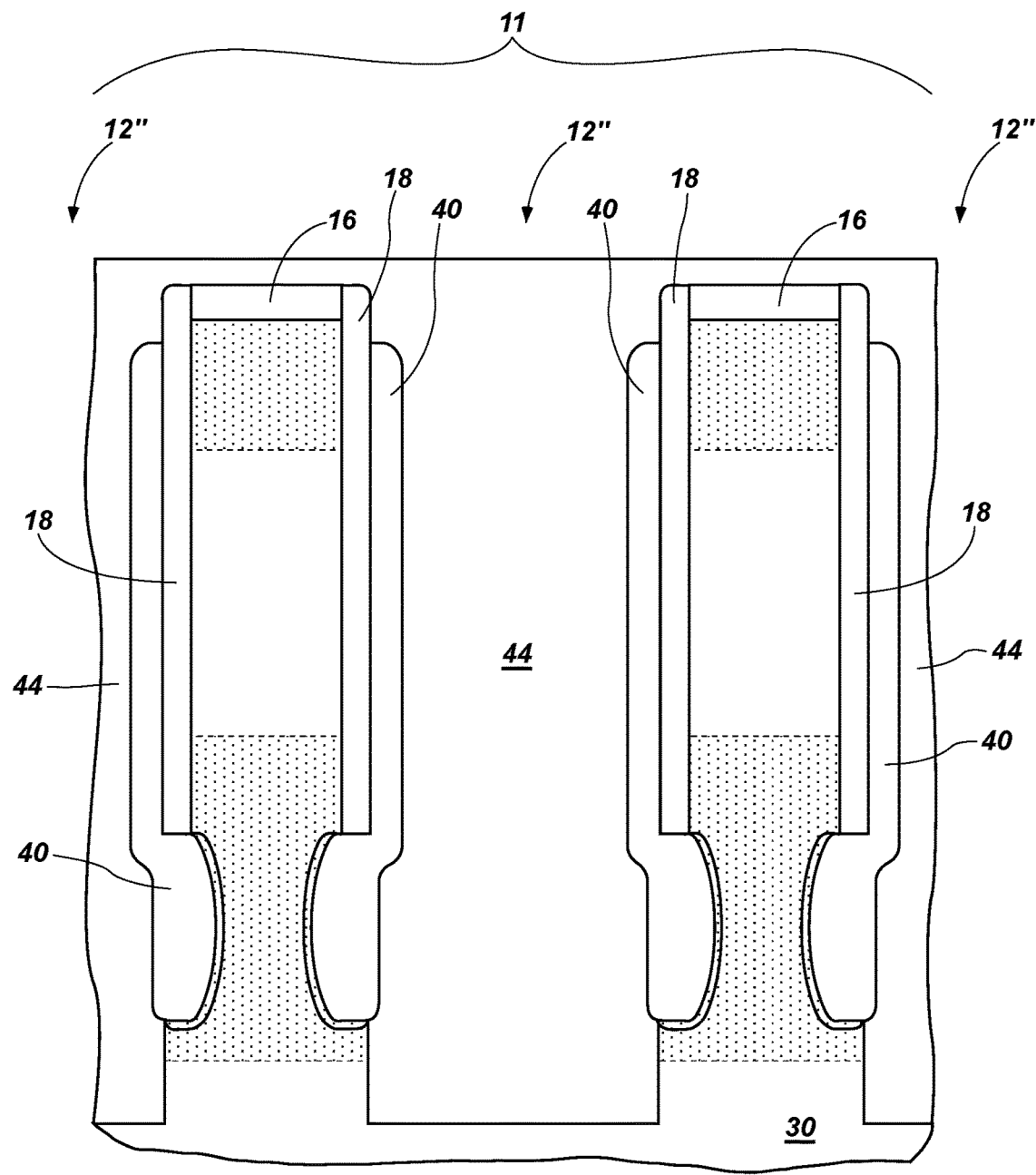

FIGS. 6A and 6B illustrate different views of the structure after further processing. FIG. 6A illustrates a cross-sectional side view of an array region 10 (e.g., a region where transistors are to be formed) of the structure. FIG. 6B illustrates a cross-sectional side view of a buried digit line end region 11 (e.g., a region where conductive contacts for connecting to the buried digit lines are to be formed) of the structure. In contrast, FIGS. 1 through 5, which are described above, illustrate structures and acts performed in both the array region 10 and the buried digit line end region 11 of the structure.

Referring now to FIG. 6A and in conjunction with FIG. 6B, the first trenches 12" in the array region 10 and in the buried digit line end region 11 may be filled with a mask material 44 (e.g., a photoresist material, a spin-on-dielectric (SOD) material, an oxide material, etc.). A portion of the mask material 44 (shown in FIG. 6A by dashed lines) may be removed from the first trenches 12" in the array region 10. By way of example and not limitation, in an embodiment in which the mask material 44 is a photoresist material, the portion of the mask material 44 may be removed by developing the mask material 44 in the array region 10 (FIG. 6A) using photolithography methods that are known in the art and, therefore, are not described in detail in the present disclosure. However, sufficient mask material 44 may remain in the buried digit line end region 11 to at least cover the metal material 40 in the buried digit line end region 11. A photolithographic mask (not shown) may be used to cover the mask material 44 to inhibit development and removal thereof in the buried digit line end region 11 while the portion of the mask material 44 is exposed to development and, consequently, removed in the array region 10. After the portion of the mask material 44 is developed and removed in the array region 10, a dry etch that selectively removes the material of the mask material 44 may be performed to remove the mask material 44 to a desired depth. For example, the mask material 44 may be removed from the first trenches 12" in the array region 10 to a depth proximate the bottom of the sidewall liners 18 in the array region 10, as shown in FIG. 6A. Optionally, the selectivity of the dry etch may be enhanced by forming an additional liner (not shown) that has etch selectivity with respect to the mask material 44 along the sidewall liners 18 of the first trenches 12" prior to filling the first trenches 12" with the mask material 44. The dry etch may also remove a portion of the mask material 44 in the buried digit line end region 11. However, the mask material 44 may have sufficient thickness in the buried digit line end region 11 to cover the metal material 40 in the buried digit line end region 11 after the dry etch. Thus, the mask material 44 may remain in the bottom of the first trenches 12" in the array region 10 to cover portions of the metal material 40 below the sidewall liners 18, such as the metal material 40 disposed at least partially within the horizontally recessed regions 20, and the mask material 44 may remain in the first trenches 12" in the buried digit line end region 11 to substantially completely cover the metal material 40.

Figure 7:
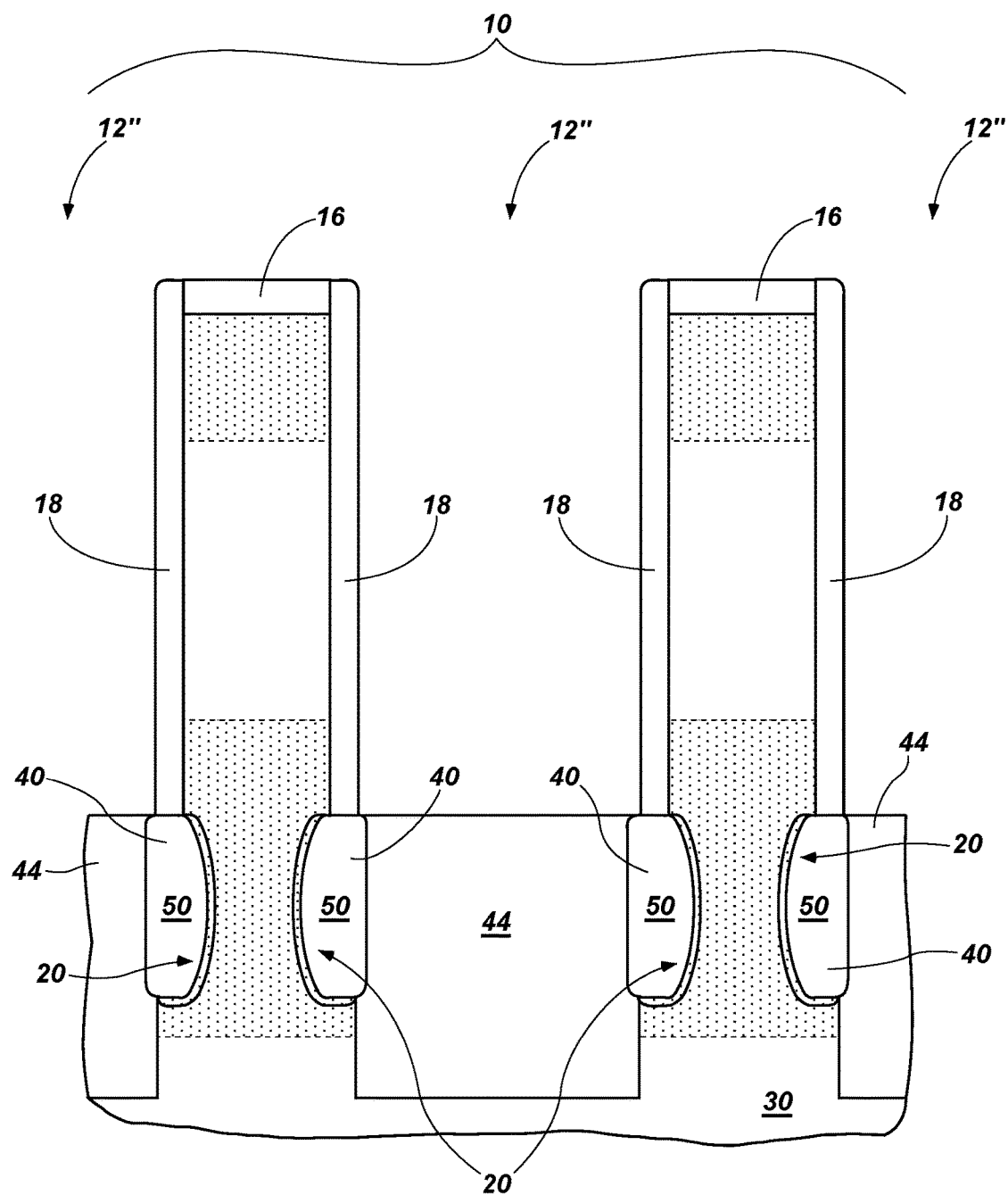

As shown in FIG. 7, the exposed metal material 40 along the sidewall liners 18 may be removed in the array region 10. By way of example and not limitation, the metal material 40 may be selectively removed from along the sidewall liners 18 by conducting an isotropic dry etch that does not remove material from the mask 16, the sidewall liners 18, and the mask material 44. The mask material 44 remaining in the bottom of the first trenches 12" may inhibit removal of the metal material 40 below the sidewall liners 18 within the horizontally recessed regions 20. The metal material 40 remaining below the sidewall liners 18 in the array region 10 may form buried digit lines 50 extending horizontally (i.e., in and out of the page when viewed in the perspective of FIG. 7) in the first direction. The mask material 44 may inhibit removal of the metal material 40 in the buried digit line end region 11 while the exposed metal material 40 is removed in the array region 10. Thus, the buried digit line end region 11 and the mask material 44 may remain substantially as illustrated in FIG. 6B.

Although the method of the present disclosure has been described with reference to FIGS. 6A through 7 as including removing the mask material 44 to a depth proximate the bottom of the sidewall liners 18 in the array region 10 and subsequently performing an isotropic dry etch to remove the metal material 40 along the sidewall liners 18, the present disclosure is not so limited. For example, in another embodiment, the mask material 44 may be substantially fully removed from within the first trenches 12" in the array region 10, leaving the metal material 40 within the first trenches 12" fully exposed in the array region 10. The removal of the mask material 44 in the array region 10 may be accomplished by developing the mask material 44 through a photolithographic mask and/or by dry etching the mask material 44. After the mask material 44 is substantially fully removed in the array region 10, the metal material 40 along the sidewall liners 18 may be removed by an etch, such as an anisotropic dry etch, while at least some of the metal material 40 in the undercut region 20 may remain due to the overlying material (e.g., the sidewall liners 18) vertically covering the metal material 40. The metal material 40 remaining in the undercut region 20 may form the buried digit lines 50.

Figure 8A:
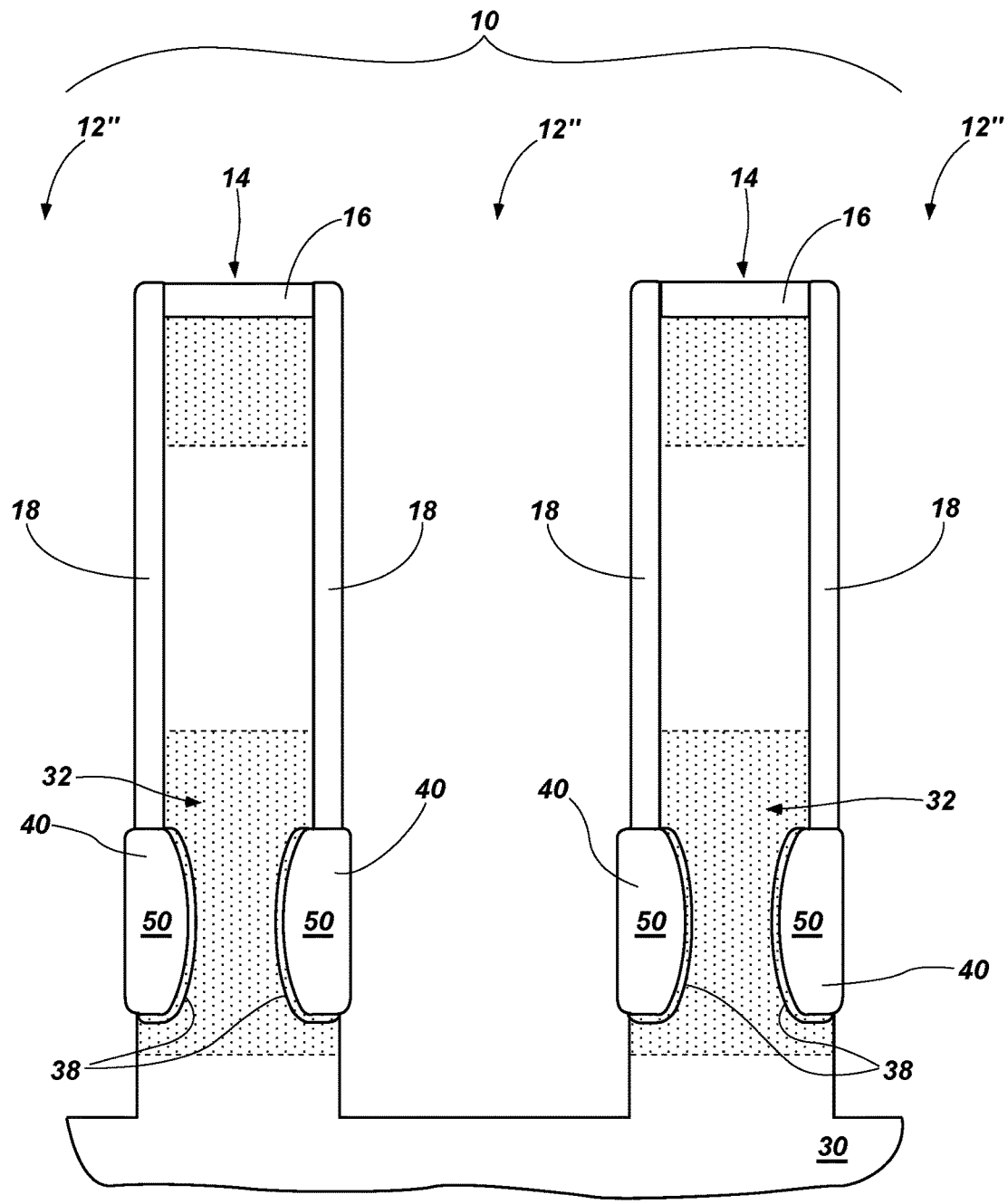
Figure 8B:
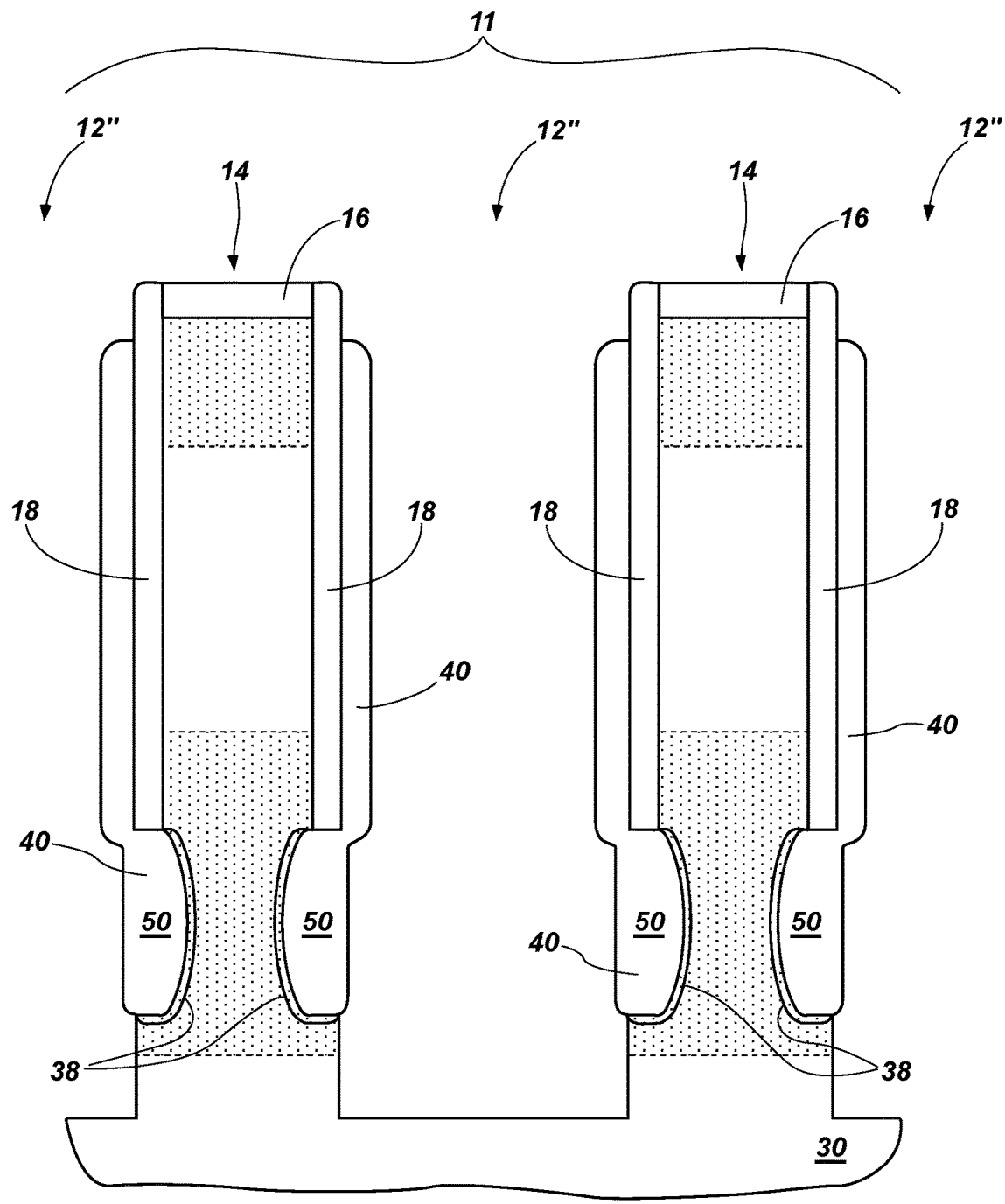

FIGS. 8A and 8B illustrate different views of the structure after further processing, as will be described below. FIG. 8A illustrates a cross-sectional side view of the array region 10 of the structure. FIG. 8B illustrates a cross-sectional side view of the buried digit line end region 11 of the structure.

After the metal material 40 is removed from along the sidewall liners 18 in the array region 10, any remaining mask material 44 (FIGS. 6A through 7) may be removed from the array region 10 and the buried digit line end region 11, resulting in the structure shown in FIGS. 8A and 8B. As shown in FIG. 8A, the structure in the array region 10 may include the first trenches 12" separating the columns 14 of the substrate 30 including the first source/drain regions 32 (e.g., the source regions). The buried digit lines 50 may contact (e.g., through the metallization material 38) the first source/drain regions 32 on each side of the columns 14 to provide electrical conductivity between each buried digit line 50 and each corresponding first source/drain region 32. The first source/drain regions 32 of adjacent columns 14 may be separated and electrically isolated from each other by the first trenches 12".

As can be seen in FIG. 8B, the buried digit line end region 11 may include the first trenches 12" separating the columns 14 of the substrate 30. The buried digit lines 50 may extend from the array region 10 (FIG. 8A) into the buried digit line end region 11 (FIG. 8B). The metal material 40 in the buried digit line end region 11 may vertically extend from the buried digit lines 50 up the sidewall liners 18 (i.e., up the sidewalls of the columns 14 defining the first trenches 12") to proximate the top of the substrate 30 in the columns 14, as described above with reference to FIG. 5. The metal material 40 along the sidewall liners 18 may be integral with (e.g., a part of the same, continuous material) the metal material 40 of the buried digit line 50. Each buried digit line 50 and associated metal material 40 may be separated from an adjacent buried digit line 50 and associated metal material 40 by the first trench 12".

FIGS. 9A and 9B show different views of a memory array 100 formed after further processing of the structure. FIG. 9A is a cross-sectional side view similar to that of FIG. 8B, taken in the buried digit line end region 11 along section line 9A-9A of FIG. 9B. FIG. 9B is a cross-sectional side view taken along section line 9B-9B of FIG. 9A, and includes portions of the array region 10 and the buried digit line end region 11.

Referring to FIGS. 9A and 9B, after the mask material 44 is removed from the first trenches 12", the structure may undergo further processing to form the memory array 100 of transistors 60, by conventional methods known in the art, which are not described in detail in the present disclosure. By way of example and not limitation, second trenches 52 may be formed in the array region 10 to separate and form a plurality of transistors 60. The second trenches 52 may horizontally extend in a second direction generally perpendicular to the first direction that the first trenches 12" extend. The second trenches 52 may vertically extend into the substrate 30 to a depth above the buried digit lines 50 disposed at least partially in the horizontally recessed regions 20 (FIG. 9A). Word lines 70 may be formed along sidewalls of the substrate 30 defining the second trenches 52. Optionally, the mask 16 (FIGS. 1 through 8B) may be removed and epitaxial silicon material 74 may be formed on the top of the transistors 60 in the array region 10 and on the top of the columns 14 in the buried digit line end region 11. The structure may be covered with a dielectric material 78, which may fill the first and second trenches 12", 52 and extend over the transistors 60 in the array region 10 and over the columns 14 in the buried digit line end region 11. The dielectric material 78 may be, for example, an oxide material (e.g., silicon oxide).

According to an embodiment of the present disclosure, contact holes 80 may be formed in the dielectric material 78 in the buried digit line end region 11, such as by anisotropic dry etching through a patterned mask, for example. The contact holes 80 may be formed such that portions (e.g., tops) of the metal material 40 on each side of each column 14 are exposed through the contact holes 80 in the dielectric material 78. The contact holes 80 may then be filled with a conductive material to form conductive contacts 84. The conductive contacts 84 may be formed of a material including a metal. By way of example and not limitation, the conductive contacts 84 may include one or more of titanium, titanium nitride (TiN), tungsten, tungsten nitride (e.g., WN), etc. In some embodiments, the conductive contacts 84 may be formed of the same material as the metal material 40 of the buried digit lines 50. Each conductive contact 84 may physically contact (e.g., touch) the metal material 40 on either side of the corresponding column 14 in the buried digit line end region 11. Thus, the metal materials 40 on either side of a particular column 14 may be electrically connected to each other through the corresponding conductive contact 84. Each conductive contact 84 may be connected to additional circuitry (not shown) for providing signals for writing to, reading from, and refreshing the transistors 60 in the array region 10, as is known in the art. In this manner, the metal material 40 may provide an electrical connection in the buried digit line end region 11 between the conductive contacts 84 and the buried digit lines 50 including metal-to-metal contacts (e.g., between the conductive contact 84 and the metal material 40) and integrally formed metals (e.g., the metal material 40 along the sidewall liners 18 and the metal material 40 of the buried digit lines 50). Therefore, the metal material 40 in the buried digit line end region 11 may be referred to as "metallic connections" between the conductive contacts 84 and the buried digit lines 50.

Although the formation of the regions 32, 34, and 36 is described above as occurring before the formation of the mask 16 and the first trenches 12 (FIG. 1), the present disclosure is not so limited. For example, in alternative embodiments, the substrate 30 may be doped to form the first source/drain region 32 after the first trenches 12 and the sidewall liners 18 are formed. The substrate 30 may be doped to form the second source/drain region 36 after the word lines 70 are formed. Thus, the substrate may be doped to form one or more of the regions 32, 34, and 36 at any convenient time in the formation of a semiconductor device, as will be appreciated by one of ordinary skill in the art.

Accordingly, the present disclosure includes methods of forming a conductive connection in a semiconductor device, including forming a buried metal digit line and directly connecting a metal contact to at least one buried metal digit line at an end thereof. Such methods may include forming an upwardly extending protrusion of the at least one buried metal digit line at the end thereof, the upwardly extending protrusion connecting the metal contact to the at least one buried metal digit line. The methods may also include forming a substrate and forming a column of substrate material along which the upwardly extending protrusion of the at least one buried metal digit line extends.

Furthermore, the present disclosure includes methods for forming a semiconductor device structure. The methods include forming a plurality of trenches in a substrate extending into an array region and into a buried digit line end region, forming a metal material in the plurality of trenches over sidewalls of the trenches, filling the plurality of trenches with a resist material to cover the metal material, removing resist material from the plurality of trenches in the array region to expose a portion of the metal material, removing the exposed portion of the metal material, and forming a plurality of conductive contacts in direct contact with the metal material in the buried digit line end region. The methods may further include vertically recessing the metal material a distance between about 0 nm and about 20 nm from an upper surface of the substrate. A mask may be formed over the resist material in the buried digit line end region to inhibit removal of the resist material from the buried digit line end region.

In addition, the present disclosure includes methods of forming a buried digit line contact. Such methods include removing a portion of a substrate to form trenches extending horizontally in an array region and in a buried digit line end region of the substrate. A metal material is formed in the trenches. A portion of the metal material is removed from within the trenches in the array region to form a plurality of buried digit lines. A plurality of metal contacts is formed to physically contact the metal material in the buried digit line end region. The method may also include inhibiting removal of a portion of the metal material along the sidewalls in the buried digit line end region with a mask formed over the metal material in the buried digit line end region while the portion of the metal material is removed from within the trenches in the array region.

The method described above with reference to FIGS. 1 through 9B may provide improved manufacturing and device performance when compared to conventional methods of forming vertical memory devices. As discussed above, embodiments of the present disclosure may provide a metallic connection between the buried digit lines 50 and the conductive contacts 84 in the buried digit line end region 11 including metal-to-metal junctions and/or integral metal (i.e., the continuous material of the buried digit line 50 and the metal material 40) and without using metal-to-silicon junctions. Problems such as crystal damage, increased oxygen absorption, loss of digit line separation, difficulties in properly doping, and non-uniform doping may be avoided by omitting the conventional act of heavily doping the columns 14 of the substrate 30 in the buried digit line end region 11. The methods of the present disclosure may be performed with the same number of masks compared to conventional methods. For example, conventional methods may use a mask to cover the array region 10 while the columns 14 are heavily doped to form a conductive connection between the conductive contacts 84 and the buried digit lines 50. However, the methods of the present disclosure may not include heavily doping the columns 14 and, therefore, may omit the mask conventionally used. Instead, the methods of the present disclosure may include using a photolithographic mask (not shown) when removing a portion of the mask material 44 in the first trenches 12" and removing the metal material 40 from along the sidewall liners 18. Therefore, the methods of the present disclosure may improve the manufacturing and device performance without the need of a greater number of masks.

Additionally, the present disclosure encompasses a memory array 100. Although the memory array 100 shown in FIGS. 9A and 9B is described above as including the array region 10 and the buried digit line end region 11, the phrase "memory array" encompasses both the array region 10 and the buried digit line end region 11.

With reference to FIGS. 9A and 9B, the memory array 100 of the present disclosure may include a plurality of transistors 60 (e.g., so-called "vertical transistors") in the array region 10 each including the first source/drain region 32, the mid-channel region 34, and the second source/drain region 36 of the substrate 30. A plurality of buried digit lines 50 including the metal material 40 may extend in the first direction (e.g., in and out of the page when viewed in the perspective of FIG. 9A, left and right when viewed in the perspective of FIG. 9B) in the array region 10 and the buried digit line end region 11 of the memory array 100. The buried digit lines 50 may be in electrical contact with the first source/drain regions 32 of the transistors 60. The buried digit lines 50 may be at least partially disposed within the horizontally recessed regions 20 of the substrate 30. A plurality of word lines 70 may be disposed along sidewalls of the transistors 60 and may extend in the second direction (e.g., in and out of the page when viewed in the perspective of FIG. 9B) perpendicular to the first direction that the buried digit lines 50 extend.

In the buried digit line end region 11, the metal material 40 may be disposed along the sidewalls defining the first trenches 12". The tops of the metal material 40 may be at or proximate the top of the substrate 30 in the columns 14. The metal material 40 along the sidewalls in the buried digit line end region 11 may be integral with the metal material 40 of the buried digit lines 50 at least partially disposed within the horizontally recessed regions 20 (i.e., undercut regions).

The first trenches 12" may be filled with the dielectric material 78 to isolate adjacent metal materials 40 and buried digit lines 50 on opposing sidewalls defining the first trenches 12". The conductive contacts 84 may be in physical and electrical contact with the tops of the metal materials 40. Each conductive contact 84 may physically contact (e.g., touch) at least one of the metal materials 40 on either side of an associated column 14 of the substrate 30. For example, each conductive contact 84 may physically contact both of the metal materials 40 on the sides of an associated column 14 of the substrate 30. The conductive contacts 84 may be electrically connected to additional circuitry (not shown), as is known in the art of memory devices. The metal material 40 along the sidewalls of the columns 14 defining the first trenches 12" in the buried digit line end region 11 may form a plurality of metallic connections between the contacts 84 and the buried digit lines 50.

Figure 10:
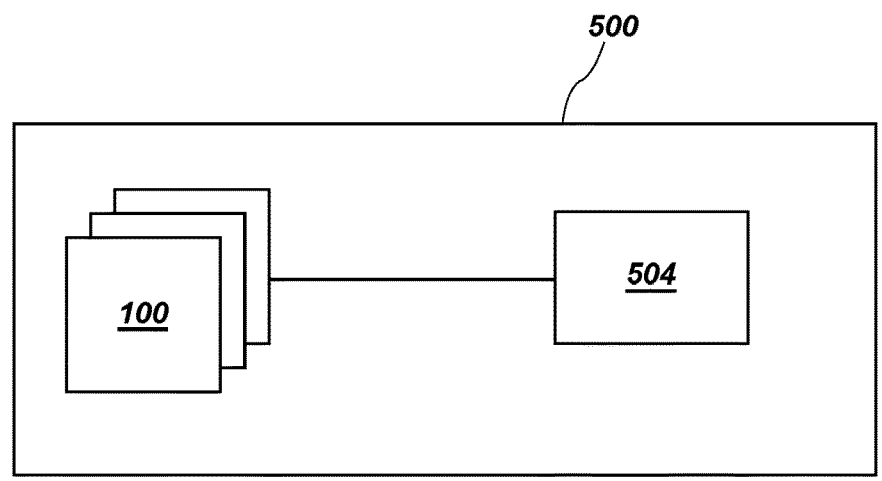
FIG. 10 is a simplified block diagram of a memory device including a memory array formed according to one or more embodiments described in the present disclosure.

With reference to FIG. 10, illustrated is a simplified block diagram of a memory device 500 implemented according to one or more embodiments described herein. The memory device 500 includes a memory array 100 and a control logic component 504. The memory array 100 may be formed as described in the present disclosure. For example, the memory array 100 may include a plurality of transistors 60 and buried digit lines 50 with corresponding metal material 40 forming metallic connections between the buried digit lines 50 and conductive contacts 84, as described above. The transistors 60 may be vertical transistors and the memory device 500 may be referred to as a "vertical memory device." The control logic component 504 may be configured to operatively interact with the memory array 100 so as to read, write, or refresh any or all transistors 60 within the memory array 100.

Accordingly, memory devices (e.g., vertical memory devices) are disclosed. The memory devices include a substrate including trenches extending in an array region and a buried digit line end region. The trenches are at least partially filled with a dielectric material that separates adjacent columns of substrate material. The memory devices also include buried digit lines including a metal material in trenches along sidewalls of the columns of substrate material. Conductive contacts including a metal are over the columns of substrate material in the buried digit line end region. Metallic connections comprising the metal material of the buried digit lines are disposed between and physically contacting the buried digit lines and the conductive contacts. The metallic connections may be integral with associated buried digit lines. Upper surfaces of the metallic connections may be proximate upper surfaces of associated columns of substrate material.

Figure 11:
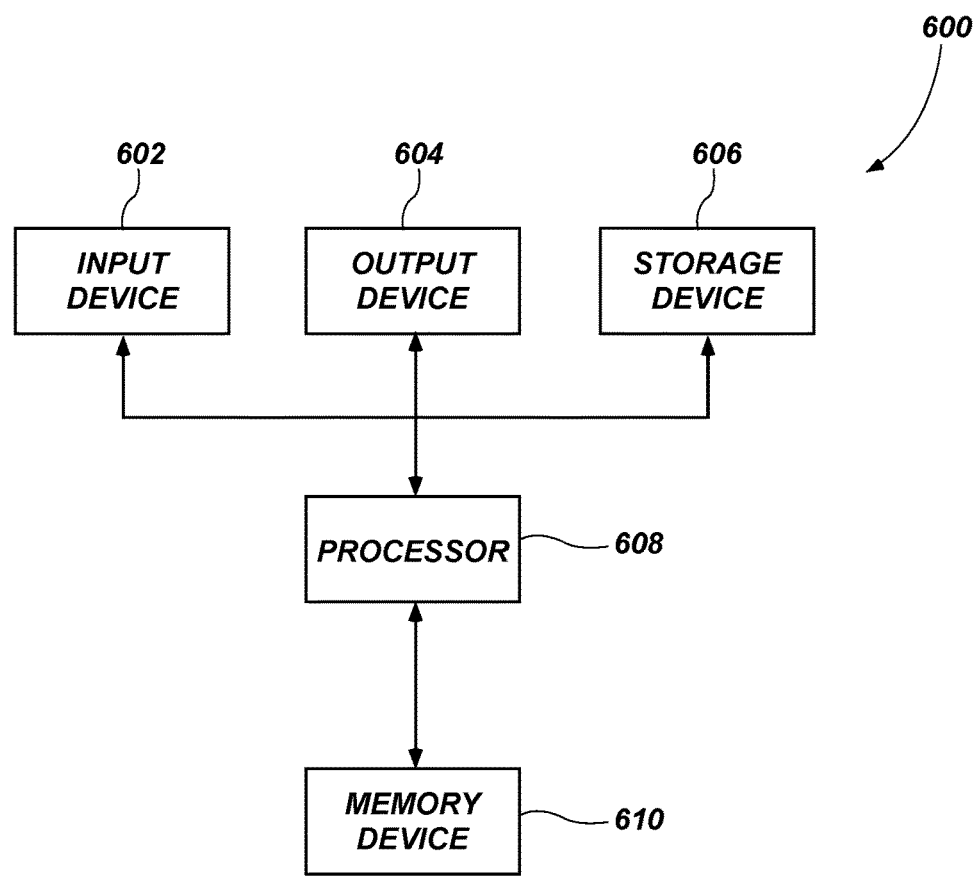
FIG. 11 is a simplified block diagram of a system implemented according to one or more embodiments described in the present disclosure.

With reference to FIG. 11, illustrated is a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker, for example. The input device 602 and the output device 604 are not necessarily separable from one another. The system 600 further includes a storage device 606. The input device 602, output device 604, and storage device 606 are coupled to a conventional processor 608. The system 600 further includes a memory device 610 coupled to the processor 608. The memory device 610 includes at least one memory array, such as the memory array 100 according to one or more embodiments described herein. The system 600 may be incorporated within a computing, processing, industrial, or consumer product. For example, without limitation, the system 600 may be included within a personal computer, a handheld device, a camera, a phone, a wireless device, a display, a chip set, a game, a vehicle, or other known systems.

Accordingly, a system is disclosed including a memory array including a plurality of transistors in an array region and a plurality of buried digit lines extending horizontally in the array region and in a buried digit line end region. A metallic connection may be associated with each buried digit line in the buried digit line end region. The metallic connection may be disposed between a buried digit line and a conductive contact.

An apparatus (e.g., a memory device 500, a system 600 including a memory device 610) is also disclosed including a plurality of transistors in an array region and a plurality of buried digit lines extending horizontally in the array region and in a buried digit line end region. In the buried digit line end region, a metal material may form a metallic connection between each buried digit line and a conductive contact. The metal material may be integrally formed with the buried digit line and may physically contact each conductive contact.

Accordingly, the present disclosure includes semiconductor device structures including a substrate, buried metal digit lines in the substrate, and metal contacts above and connected to metal of the buried metal digit lines at ends of the buried metal digit lines. The semiconductor device structure may include a metal material including the metal of the buried metal digit lines between and connecting each buried metal digit line and an associated metal contact. The metal of the metal contacts and of the buried metal digit lines may include the same material. The structure may also include columns of a substrate material along which the metal material is disposed. The metal material may extend from the buried metal digit lines to proximate upper surfaces of the substrate material of the columns.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure encompasses all modifications, combinations, equivalents, and alternatives falling within the scope of the invention as defined by the following appended claims and their legal equivalents.

What is claimed is:

1. An apparatus comprising a memory cell array comprising an array region and an end region proximate to the array region, wherein the memory cell array comprises:
   at least one buried bit line extending in a first direction, the at least one buried bit line comprising a first portion in the array region and a second portion in the end region, the first portion comprising first connection parts, and the second portion comprising at least one second connection part;
   pillar transistors in the array region, each of the pillar transistors in contact with an associated one of the first connection parts of the first portion of the at least one buried bit line;
   buried word lines in the array region, each of the buried word lines extending in a second direction along a sidewall of an associated one of the pillar transistors, and the second direction being substantially perpendicular to the first direction;
   at least one semiconductor pillar in the end region, the at least one semiconductor pillar in contact with the at least one second connection part of the second portion of the at least one buried bit line; and
   at least one conductive connection in the end region, the at least one conductive connection protruding upwardly from the at least one second connection part of the second portion of the at least one buried bit line along a sidewall of the at least one semiconductor pillar.

2. The apparatus of claim 1, wherein the memory cell array further comprises at least one conductive contact in the end region, the at least one conductive contact in contact with the at least one conductive connection.

3. The apparatus of claim 2, wherein each of the at least one buried bit line, the at least one conductive connection and the at least one conductive contact comprises a metal.

4. The apparatus of claim 2, wherein each of the buried word lines is higher in level than the at least one buried bit line.

5. The apparatus of claim 4, wherein the at least one conductive connection protrudes upwardly higher than each of the buried word lines.

6. The apparatus of claim 1, wherein the at least one semiconductor pillar includes a first recess region that is in contact with the at least one second connection part of the second portion of the at least one buried bit line.

7. The apparatus of claim 6, wherein each of the pillar transistors comprises a lower portion, an upper portion and a middle portion between the lower portion and the upper portion, the lower portion including a second recess region that is in contact with an associated one of the first connection parts of the first portion of the at least one buried bit line.

8. The apparatus of claim 1, wherein:
   the at least one semiconductor pillar comprises a first lower portion of a first conductivity type, a first upper portion of the first conductivity type and a first middle portion of a second conductivity type between the first lower portion and the first upper portion, the first lower portion including a first recess region that is in contact with the at least one second connection part of the second portion of the at least one buried bit line; and
   each of the pillar transistors comprises a second lower portion of the first conductivity type, a second upper portion of the first conductivity type and a second middle portion of the second conductivity type between the second lower portion and the second upper portion, the second lower portion including a second recess region that is in contact with an associated one of the first connection parts of the first portion of the at least one buried bit line.

* * * * *

UNITED STATES PATENT AND TRADEMARK OFFICE
CERTIFICATE OF CORRECTION

PATENT NO. : 10,347,634 B2  
APPLICATION NO. : 15/942938  
DATED : July 9, 2019  
INVENTOR(S) : Shyam Surthi and Suraj Mathew Page 1 of 1

It is certified that error appears in the above-identified patent and that said Letters Patent is hereby corrected as shown below:

In the Specification

Column 1, Line 9, change "Apr. 17, 2018 the" to --Apr. 17, 2018, the--

Signed and Sealed this  
Twenty-seventh Day of August, 2019

Andrei Iancu  
*Director of the United States Patent and Trademark Office*